(12) United States Patent
Cheng et al.

(10) Patent No.: US 9,105,799 B2
(45) Date of Patent: Aug. 11, 2015

(54) APPARATUS AND METHOD FOR PRODUCING SOLAR CELLS USING LIGHT TREATMENT

(71) Applicant: TSMC Solar Ltd., Taichung (TW)

(72) Inventors: Hao-Yu Cheng, Kaohsiung (TW); Yung-Sheng Chiu, Fuxing Township (TW); Yi-Feng Huang, Kaohsiung (TW); Chen-Yun Wang, Kaohsiung (TW); Chi-Yu Chiang, Taoyuan (TW); Hsuan-Sheng Yang, Taipei (TW); Kuan-Min Lin, Hsin-Chu (TW)

(73) Assignee: TSMC Solar Ltd., Taichung (TW)

( * ) Notice: Subject to any disclaimer, the term of this patent is extended or adjusted under 35 U.S.C. 154(b) by 0 days.

(21) Appl. No.: 13/913,540

(22) Filed: Jun. 10, 2013

(65) Prior Publication Data

US 2014/0363918 A1 Dec. 11, 2014

(51) Int. Cl.
*H01L 31/18* (2006.01)

(52) U.S. Cl.
CPC .............. *H01L 31/18* (2013.01); *H01L 31/186* (2013.01)

(58) Field of Classification Search
CPC .......................... H01L 31/186; H01L 31/1864
USPC .......................................................... 438/95
See application file for complete search history.

(56) References Cited

U.S. PATENT DOCUMENTS

| | | | | |
|---|---|---|---|---|
| 3,599,059 A * | 8/1971 | Hou | ................................ | 257/614 |
| 4,152,535 A * | 5/1979 | Deminet et al. | .............. | 136/258 |
| 4,935,383 A * | 6/1990 | Nouhi et al. | ................... | 117/104 |
| 6,576,112 B2 * | 6/2003 | Sonoda et al. | ................ | 205/155 |
| 6,683,695 B1 | 1/2004 | Simpson et al. | | |
| 6,770,143 B2 | 8/2004 | Zhang et al. | | |
| 7,141,449 B2 * | 11/2006 | Shiozaki | .......................... | 438/94 |
| 8,298,849 B2 * | 10/2012 | Ding et al. | ...................... | 438/57 |
| 8,309,390 B2 * | 11/2012 | Lerchenberger et al. | ........ | 438/85 |
| 8,354,586 B2 * | 1/2013 | Thomsen et al. | ............. | 136/256 |

(Continued)

FOREIGN PATENT DOCUMENTS

| | | |
|---|---|---|
| TW | 201322476 A1 | 6/2013 |
| WO | 2013000894 A2 | 1/2013 |

OTHER PUBLICATIONS

Villanueva (Villanueva, John "Radiation from the Sun" universetoday.com article Mar. 19, 2010).*

(Continued)

*Primary Examiner* — Eva Y Montalvo
*Assistant Examiner* — Grant Withers
(74) *Attorney, Agent, or Firm* — Duane Morris LLP

(57) ABSTRACT

An light apparatus used in forming a solar cell includes a housing separate from other processing in a deposition processing system, a transport mechanism for carrying a solar cell into the housing after deposition of a front contact layer in the deposition processing system, and one or more light source elements arranged to apply light on the solar cell after deposition of the front contact layer. A method of making a solar cell includes forming a back contact layer on a glass substrate, forming an absorber layer on the back contact layer, forming a buffer layer on the absorber layer, and forming a front contact layer above the buffer layer, the glass substrate, back contact layer, absorber layer, buffer layer, and front contact layer forming a first module. The method includes applying a light source to the first module after forming the front contact layer separate from other processing.

19 Claims, 5 Drawing Sheets

(56) References Cited

U.S. PATENT DOCUMENTS

| | | | |
|---|---|---|---|
| 8,361,826 B2* | 1/2013 | Kim et al. | 438/57 |
| 8,394,659 B1* | 3/2013 | Ding et al. | 438/57 |
| 8,633,476 B2* | 1/2014 | Kim et al. | 257/40 |
| 8,728,855 B2* | 5/2014 | Korevaar et al. | 438/95 |
| 2004/0247779 A1 | 12/2004 | Seivamanickam et al. | |
| 2009/0205707 A1* | 8/2009 | Ikenoue et al. | 136/255 |
| 2010/0073011 A1 | 3/2010 | Svidenko et al. | |
| 2010/0109058 A1* | 5/2010 | Sakata et al. | 257/288 |
| 2010/0184249 A1* | 7/2010 | Chen | 438/72 |
| 2010/0210064 A1* | 8/2010 | Hakuma et al. | 438/95 |
| 2010/0224247 A1* | 9/2010 | Bartholomeusz et al. | 136/256 |
| 2010/0267190 A1* | 10/2010 | Hakuma et al. | 438/95 |
| 2011/0204045 A1 | 8/2011 | Moffatt | |
| 2011/0263072 A1* | 10/2011 | Lee et al. | 438/95 |
| 2012/0174957 A1* | 7/2012 | Nishimura et al. | 136/244 |
| 2012/0180869 A1* | 7/2012 | Jee et al. | 136/262 |
| 2012/0237695 A1 | 9/2012 | Pye et al. | |
| 2012/0319090 A1 | 12/2012 | Shinkai et al. | |
| 2012/0329195 A1* | 12/2012 | Leidholm et al. | 438/62 |
| 2013/0061903 A1* | 3/2013 | Mitzi et al. | 136/244 |
| 2013/0089944 A1* | 4/2013 | Rhieu | 438/72 |
| 2013/0129878 A1 | 5/2013 | Tzioumakis et al. | |
| 2013/0139878 A1* | 6/2013 | Bhatnagar et al. | 136/256 |
| 2013/0171757 A1* | 7/2013 | Ponnekanti et al. | 438/57 |
| 2013/0206222 A1 | 8/2013 | Ha et al. | |
| 2013/0228221 A1* | 9/2013 | Moslehi et al. | 136/256 |
| 2013/0306150 A1* | 11/2013 | Dounas et al. | 136/261 |
| 2013/0327391 A1* | 12/2013 | Gloeckler et al. | 136/256 |
| 2013/0327393 A1* | 12/2013 | Lee et al. | 136/256 |
| 2014/0076392 A1* | 3/2014 | Lin et al. | 136/256 |
| 2014/0109949 A1* | 4/2014 | Avellan et al. | 136/244 |
| 2014/0120649 A1* | 5/2014 | Nakahama et al. | 438/66 |
| 2014/0127851 A1* | 5/2014 | Yamamoto et al. | 438/95 |
| 2014/0134784 A1* | 5/2014 | Lin et al. | 438/95 |
| 2014/0134838 A1* | 5/2014 | Gossman et al. | 438/609 |
| 2014/0137938 A1* | 5/2014 | Takegami | 136/256 |
| 2014/0170804 A1 | 6/2014 | Chiu et al. | |
| 2014/0273313 A1* | 9/2014 | Kumar et al. | 438/16 |
| 2014/0273331 A1* | 9/2014 | Solomon et al. | 438/71 |
| 2014/0287551 A1* | 9/2014 | Wieting | 438/98 |
| 2014/0304987 A1* | 10/2014 | Ando | 29/830 |
| 2015/0004743 A1* | 1/2015 | Addepalli et al. | 438/94 |

OTHER PUBLICATIONS

Pern, John "Module Encapsulation Materials, Processing and Testing" available online from www.nrel.gov/docs/fy09osti/44666.pdf as of Jun. 11, 2011 pp. 1-33.*

Zhu-Ge, Fei "Electrical and optical properties of Al—N co-doped p-type zinc oxide films" Jour. of Crys. Grow. vol. 268, Iss. 1-2 Jun. 15, 2004 pp. 163-168.*

Oladeji, Isaiah "Optimization of Chemical Bath Deposited Cadmium Sulfide Thin Films" J. Electrochem. Soc. vol. 144, No. 7, Jun. 1997 pp. 2342-2346.*

Lany, S. et al., "Light-and bias-induced metastabilities in Cu(In,Ga)Se2 based solar cells caused by the (VSe-VCu) vacancy", J. Appl.Phys., 2006, 100:113725-1-113725-15.

Official Action issued May 13, 2015 in counterpart Taiwan Patent Application.

* cited by examiner

APPARATUS AND METHOD FOR PRODUCING SOLAR CELLS USING LIGHT TREATMENT

CROSS-REFERENCE TO RELATED APPLICATIONS

N/A

FIELD

The present disclosure relates generally to the field of photovoltaics, and more specifically to an apparatus and method for producing solar cells using light treatment such as ultra-violet (UV) light.

BACKGROUND

Copper indium gallium diselenide (CIGS) is a commonly used absorber layer in thin film solar cells. CIGS thin film solar cells have achieved excellent conversion efficiency (>20%) in laboratory environments. Typical voltage-current characteristics, known as the IV curve, of a diode without and with illumination demonstrates that an applied potential is in the forward bias direction. Such an IV curve shows the turn-on and the buildup of the forward bias current in a diode. Without illumination, no current flows through the diode unless there is external potential applied. With incident sunlight, the IV curve shifts up and indicates that there is external current flow from the solar cell to a passive load. Short circuit current, Isc, flows with zero external resistance (V=0) and is the maximum current delivered by the solar cell at any illumination level. Similarly, the open circuit voltage, Voc, is the potential that develops across the terminals of the solar cell when the external load resistance is very large. The power delivered to the load is of course zero at both extremes and reaches a maximum (Pmax) at a finite load resistance value. Pmax is typically shown as the area of a shaded rectangle. A commonly used number that characterizes the solar cell is the fill factor, FF, which is defined as the ratio of Pmax to the area of the rectangle formed by Voc and Isc.

The efficiency of a solar cell is the ratio of the electrical power it delivers to the load, to the optical power incident on the cell. Maximum efficiency is when power delivered to the load is Pmax Incident optical power is normally specified as the solar power on the surface of the earth which is approximately 1 mW/mm 2 Techniques to improve efficiency can cause other issues that tend to reduce the effective usefulness of the solar cell.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
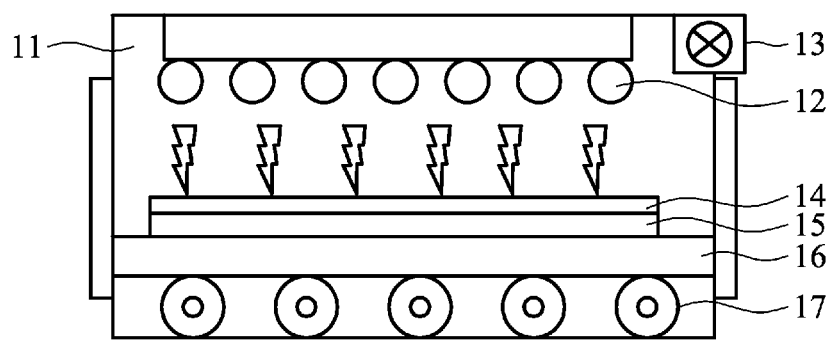
FIG. 1 is a schematic diagram illustrating a side view of an example of a portion of a solar cell forming apparatus with an irradiated solar cell according to embodiments of the present disclosure.

With reference to the figures, where like elements have been given like numerical designations to facilitate an understanding of the drawings, the various embodiments of a multi-gate semiconductor device and methods of forming the same are described. The figures are not drawn to scale.

The following description is provided as an enabling teaching of a representative set of examples. Many changes can be made to the embodiments described herein while still obtaining beneficial results. Some of the desired benefits discussed below can be obtained by selecting some of the features or steps discussed herein without utilizing other features or steps. Accordingly, many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components.

As used herein, use of a singular article such as "a," "an" and "the" is not intended to exclude pluralities of the article's object unless the context clearly and unambiguously dictates otherwise.

Improved apparatus and processes for manufacturing thin film solar cells are provided. With reference to FIG. 1, a light apparatus 10 used in forming a solar cell can include a housing 11 separate from other processing in a deposition processing system (not shown), a transport mechanism (such as a carrier 16 on rollers 17) for carrying a solar cell 14 on a substrate 15 into and out of the housing 11 after deposition of a front contact layer in the deposition processing system, and one or more light source elements 12 within the housing 11 arranged to apply light on the solar cell 14 after deposition of the front contact layer. In one embodiment, the one or more light source elements 12 are one or more ultraviolet (UV) light source elements where the housing 11 can form a UV light treatment chamber with the one or more UV source elements having tunable light intensity. The light intensity can be controlled with a controller (not shown) coupled to the one or more light sources. The light apparatus can also include an environmental temperature control system 13 within the housing which can be used to control the temperature within the housing and may also control the light intensity in some embodiments. The UV light source elements 12 can produce light at a plurality of wavelength ranges in the range below about 400 nm.

Figure 2:
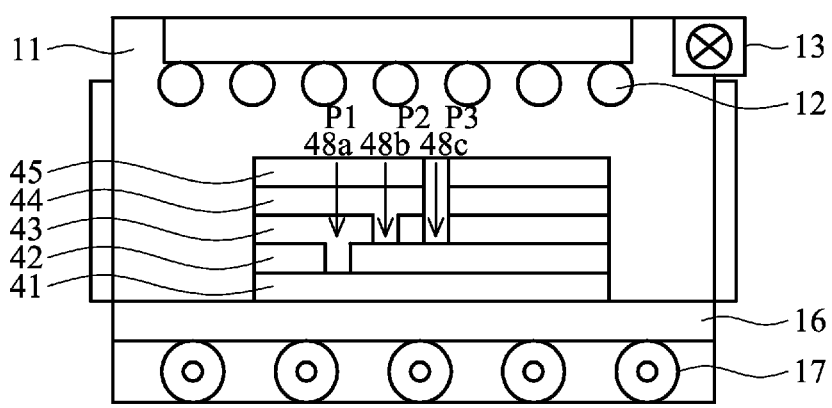
FIG. 2 is schematic diagram illustrating a side view of another example of a portion of a solar cell forming apparatus with another irradiated solar cell during manufacture according to embodiments of the present disclosure.

The application of light to the solar cell can be done at various stages of manufacture. In one embodiment as shown in the light apparatus 20 of FIG. 2, the light can be applied after the steps involving deposition of a front contact layer (such as a transparent conductive oxide (TCO) layer) 45 and P3 scribing (48c) of the solar cell in the deposition processing system. The solar cell in FIG. 2 as shown includes a back contact layer 42 such as molybdenum on a substrate 41 (such as glass or alternatively a flexible substrate), an absorption layer 43 on the back contact layer 42, a buffer layer 44 on the absorption layer 43, and the front contact layer 45 on the buffer layer 44. P1 scribing (48a) occurs after application of the back contact layer 42 on the substrate 41. P2 scribing (48b) occurs after application of the absorption layer 43 on the back contact layer 42. P3 scribing (48c) occurs after application of the front contact layer 45 (or TCO) on the buffer layer 44.

Figure 3:
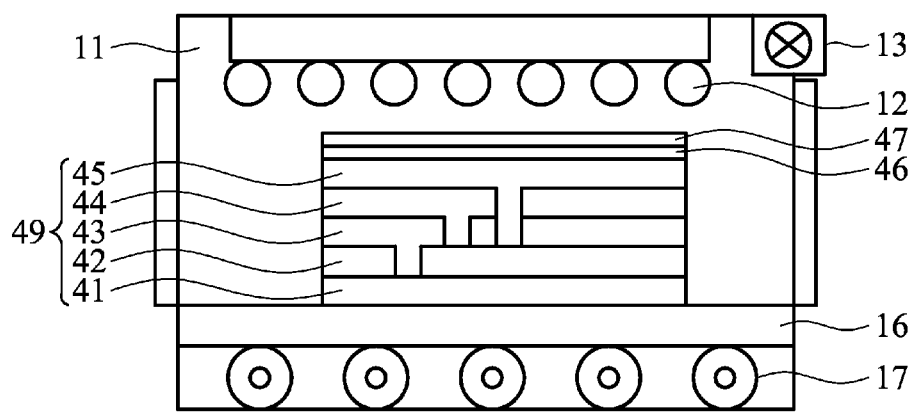
FIG. 3 is a schematic diagram illustrating a side view of another example of a solar cell forming apparatus including with yet another irradiated solar cell during manufacture according to some embodiments.

In another embodiment as shown in the light apparatus 30 of FIG. 3, the light is applied after the steps involving deposition of the front contact layer layer, P3 scribing of the solar cell, application of an ethylene vinyl acetate (EVA) layer 46, and lamination 47 as shown in FIG. 3. The layers 41-45 as explained above along with the EVA layer 46 and lamination 47 can form a solar cell 49 as shown. Thus, the light from the light source 12 is applied to a completed solar cell in one embodiment.

Figure 4:
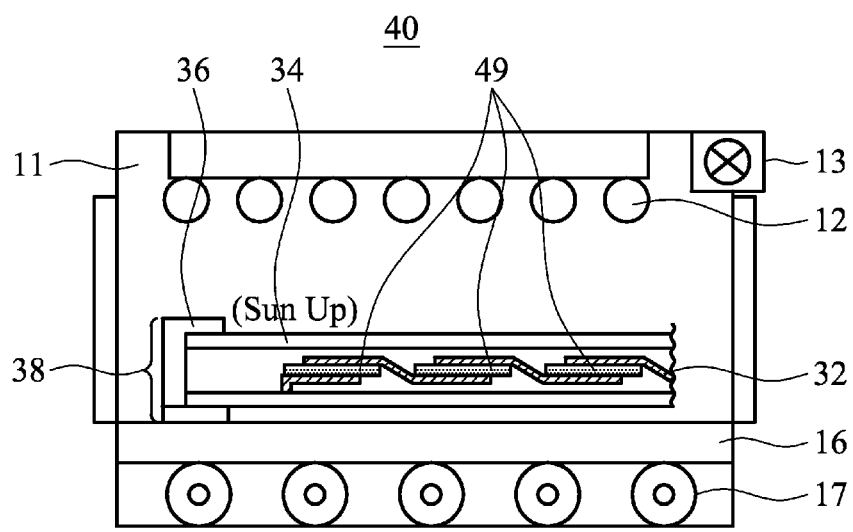
FIG. 4 is a schematic diagram illustrating a side view of another example of a solar cell forming apparatus including an irradiated solar cell module during manufacture according to some embodiments.

In yet another embodiment as shown in the light apparatus 40 of FIG. 4, the light is applied after the steps of deposition of the front contact layer, P3 scribing of the solar cell, application of ethylene vinyl acetate (EVA), a lamination process, a backend process, and a solar cell module completion as shown in FIG. 4. In addition to the steps described above with respect to the solar cell 49, the completion of a solar cell module 38 can involve the coupling or connection of multiple solar cells 49 using interconnections 32 between the various solar cells 49 in the module 38. The module 38 can further include one or more glass layers 34 that is held together in a frame 36 for example. Before the module is completed, backend processes can also be performed. Thus, instead of applying UV light in a deposition processing system after P3 scribing as in FIG. 2, UV light can be applied after substantially completing the solar cell as in FIG. 3 or after completing or substantially completing a module as in FIG. 4.

Other variations on the theme of applying light at various stages of manufacture are also contemplated. For example, light can be applied after any one or more of the steps of P3 scribing of the solar cell, a lamination process, and solar cell module completion. In another variation, light can be applied after each of the steps of P3 scribing of the solar cell, a lamination process, and solar cell module completion. Further note that the solar cell under manufacture can be any one of a chalcopyrite-based device (Cu,In,Ga,S or CIGS), a chalcopyrite-based tandem structure device, or a cadmium telluride based device.

The various disclosed embodiments generally improve conversion efficiency or power output of CIGS thin-film solar cells or other type solar cells by implementing an additional UV light treatment process after TCO deposition in thin-film solar cell production lines. Light irradiation during chemical vapor deposition (CVD) and/or right after CVD process chamber effectively reduces resistivity of TCO film, but the contamination or "dirtying" of the irradiation source inside a chamber would become worse and increase maintenance costs. Although a number of light sources can be used, the use of long-wavelength near infrared (NIR) light as a source of light would also increase panel's temperature during an irradiation period which would degrade the absorber layer quality and final the conversion efficiency or power output rather than improve such parameters.

UV light with light energy greater than about 3.1 eV and having a main light source wavelength less than about 400 nm provides less of a heat concern than other light sources and can also enable longer or extended treatment of light or "light soaking" without adverse effects. Appropriate extended light treatment can provide greater efficiency and/or power output. Light sources or light sources and their environments that accumulate heat during irradiation of the solar cell on the other hand can limit the effectiveness and even damage the solar cell. Thus, the embodiments enable additional UV light treatment after front contact or TCO application and further allows for stand-alone UV light treatment at various different steps in the process of manufacture. The treatment can also be applied to different product types and sizes. For example, the treatment can be applied to solar cell modules having a 100 cells or 133 cells in another embodiment. Other improvements of the embodiments herein include improvement in open circuit voltage (Voc), fill factor (FF), series resistance (Rs), and shunt resistance (Rsh). Other methods to improve fill factor by reducing the resistance of a TCO film by increasing a doping concentration of extrinsic dopants, however, degrades the transmittance and yields lower short circuit current or Jsc or conversion efficiency.

In another particular embodiment, a UV light treatment process is performed after TCO deposition in a thin-film solar cell manufacture line. The stand-alone light treatment apparatus can include a light source, a tunable light intensity and an environmental temperature controlling system. The light source should include at least one portion of UV light having a wavelength less than about 400 nm. In one embodiment, the UV wavelength can in the 280 nm to 400 nm range. In some arrangements, the light source can be selected or composed as UV range from about 100 nm to about 400 nm. In another arrangement, the light source can include UV and visible light ranges from about 100 nm to 800 nm in wavelength. In yet another arrangement, the light source can include UV+visible+IR ranges or from about 100 nm to about 1500 nm in wavelenth.

Figure 5:
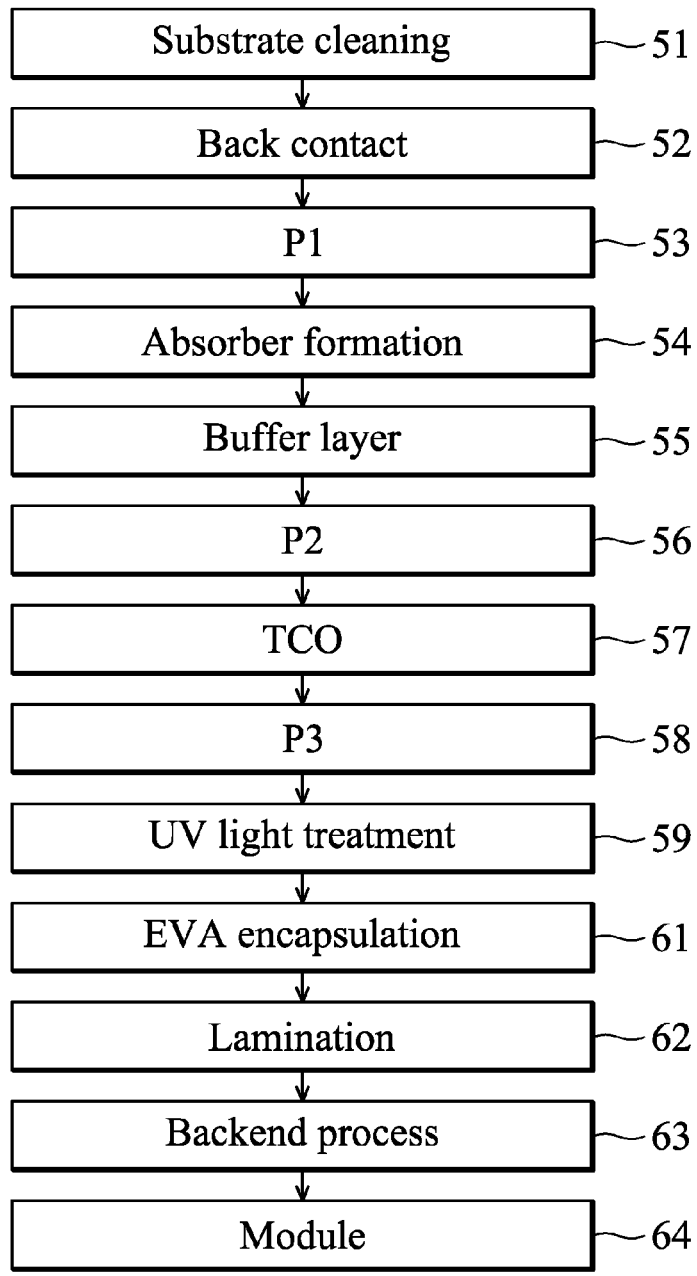
FIG. 5 is a flow chart illustrating a method of forming a solar cell according to an embodiment of the present disclosure.

The UV light treatment process can be applied between P3 scribing and EVA encapsulation process as shown in the method 50 of FIG. 5. The method 50 can include substrate cleaning at 51, application of a back contact layer on the substrate at 52, P1 scribing of the back contact layer at 53, application of an absorber layer at 54 on the back contact layer after P1 scribing, and application of a buffer layer at 55 on the absorber layer. At 56, P2 scribing is performed on the buffer layer. At 57, the front contact layer or TCO is applied to the buffer layer and then P3 scribing (of the front contact layer, buffer layer and absorber layer) is performed at 58. As noted above, UV light treatment is performed at 59 in this embodiment. Subsequently, EVA encapsulation at 61, lamination at 62, and a backend process 63 is performed before the formation of a module from multiple solar cells.

Figure 6:
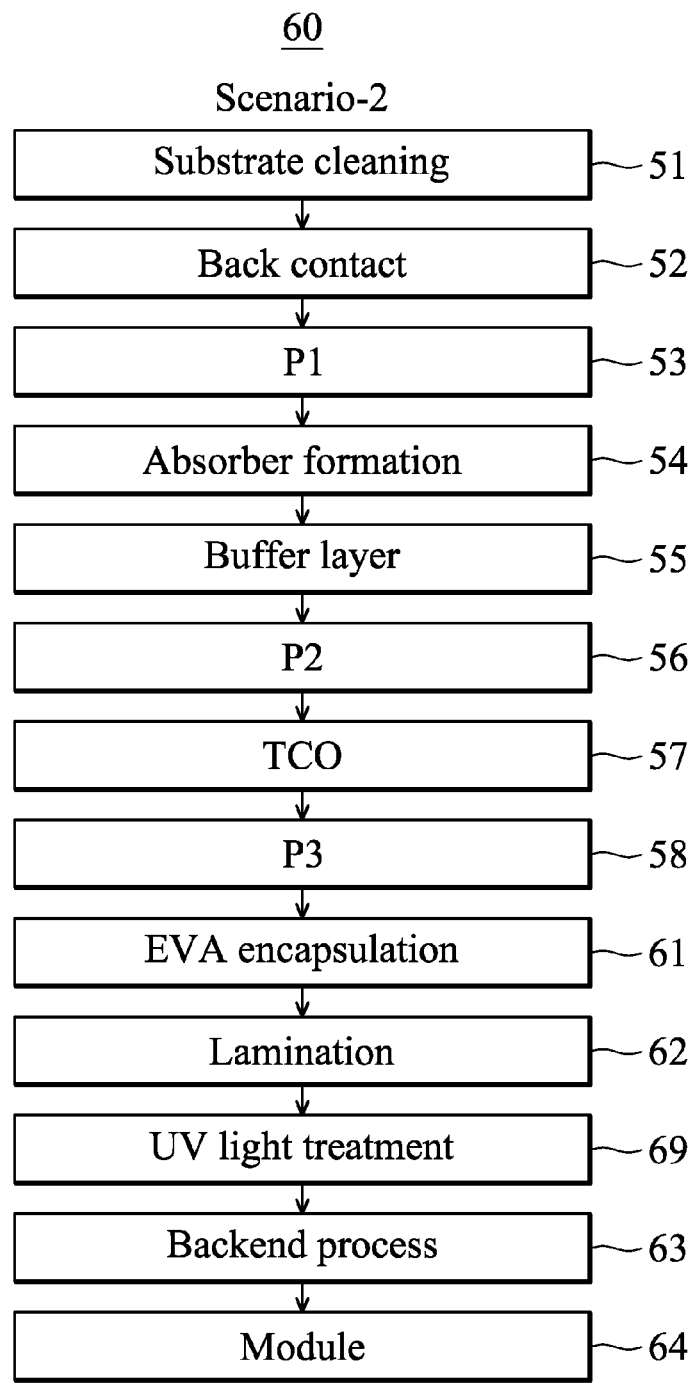
FIG. 6 is another flow chart illustrating another method of forming a solar cell according to an embodiment of the present disclosure.

The light treatment process can be applied after EVA encapsulation or lamination process as shown in an alternative embodiment of method 60 of FIG. 6. In such an instance, the EVA material should possess a high-transmittance ability of the UV region (from about 280 nm to about 400 nm in wavelength) which the UV light passes through and into the EVA material. The method 60 follows the steps 51-58 of method 50. Instead of applying UV light after P3 scribing, the method 60 further performs EVA encapsulation at 61 and lamination at 62 before applying UV light treatment at 69. Subsequently, the method 60 performs the backend process at 63 and assembles the module at 64.

Figure 7:
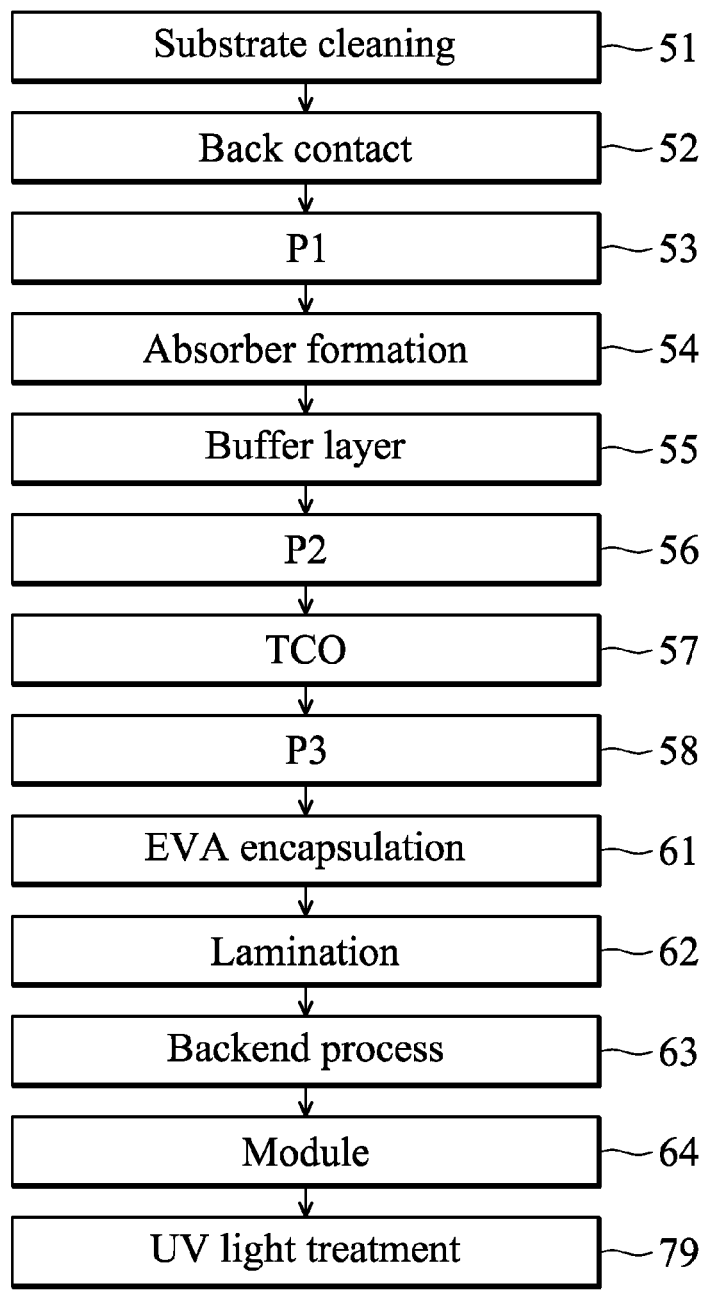
FIG. 7 is another flow chart illustrating yet another method of forming a solar cell according to an embodiment of the present disclosure.

In yet another embodiment, the light treatment process can be applied at 79 after module completion at 64 as shown in method 70 of FIG. 7. The method 70 follows the steps 51-62 of method 60. The continues with the backend process at 63 and module assembly at 64. Instead of applying UV light after lamination (at 62 as in method 60), the method 70 applies UV light at 79 after a module is assembled at 64. In yet another embodiment, the UV light can be applied after an array of modules have been assembled.

Using the methods described herein, better conversion efficiency can be achieved for chalcopyrite-based devices, or for chalcopyrite-based tandem structure devices, or for CdTe-based devices. The front contact layer or TCO layer can be a stable metal oxide, oxynitride or nitride layer with a selected extrinsic IIIA dopant (B, Al, Ga, or In, for example). The TCO layer can be fabricated by either atomic layer deposition (ALD), chemical vapor deposition (CVD), or evaporation or sputtering (PVD) process.

Using the techniques disclosed herein, solar cells can be manufactured having high performance of module power or conversion efficiency where such devices can be manufactured at a low cost with a high yield of production. Such embodiments, particularly embodiments using UV light can provide such performance without the side effect of degrading absorber quality due to heat accumulation. Furthermore, the embodiments herein can easily be installed and integrated with current CIGS solar cell production lines in a manner that is controllable and stable.

The exposure to light energy has been found to reduce the resistivity of the TCO film without degrading transmittance of the TCO film. Different light energies are used depending on the nature of the TCO film and the nature of the structure being irradiated. The wavelengths of light used may depend on the interface or interfaces formed between the TCO film and another material such as a glass or flexible substrate, or the interface between the TCO film and the stack of solar cell films, i.e. the films that combine to form the photovoltaic solar cell. The exposure to light energy after film formation lowers resistivity of the TCO film without reducing transmittance.

In some embodiments, the solar cell device is a CIGS, $Cu(In,Ga)Se_2$, type solar cell. Other solar cells are used in other embodiments. In one embodiment, the deposited TCO film is indium tin oxide, ITO. In another embodiment, the deposited TCO film is ZnO. According to other embodiments, the TCO film is AZO (aluminum-doped zinc-oxide), BZO (boron-doped zinc-oxide), GZO (gallium-doped zinc-oxide) or indium-doped cadmium oxide or other suitable TCO films.

The type of light that is used to soak or irradiate the deposited TCO or other film, is dependent upon the nature of the TCO or other film and the relationship of the film with other components of the solar cell. It has been found that light with energy greater than about 3.1 eV (blue light to uv light, $\lambda<400$ nm) improves the quality of the TCO film, the TCO interface with a glass base substrate and the interface between the TCO film and the solar cell films. As such, various combinations and sequences of light within the full energy range of about 3.1 eV or greater and within the wavelength range of below about 400 nm is used, but other energies and wavelengths are used in other embodiments. In one embodiment, a first light having a first wavelength range is used for a first time period then a second light having a second wavelength range is used for a second time period and this sequence may be repeated in various embodiments.

The composite time and energy of light irradiation is chosen to sufficiently lower resistance of TCO layer without adversely affecting its transmittance. Various light energies, various combinations of light energies and various times are used depending on the nature of the TCO layer, the type of solar cell, the nature of the base substrate, and the relationship between the TCO layer and the other components of the solar cell.

According to one aspect of the disclosure, a light apparatus used in forming a solar cell includes a housing separate from other processing in a deposition processing system, a transport mechanism for carrying a solar cell on a substrate into the housing after deposition of a front contact layer in the deposition processing system, and one or more light source elements within the housing arranged to apply light on the solar cell after deposition of the front contact layer. The one or more light source elements can be one or more ultraviolet (UV) light source elements where the housing forms a UV light treatment chamber with the one or more UV source elements having tunable light intensity. The solar cell can be one of a chalcopyrite-based device, a chalcopyrite-based tandem structure device, or a cadmium telluride based device. The transport mechanism can be a carrier and roller that transports the solar cell in and out of the housing. The light apparatus can further include an environmental temperature control system within the housing. In one embodiment, the one or more UV light source elements produce light at a plurality of wavelength ranges in the range below about 400 nm. The application of light can be done after the steps of deposition of a transparent conductive oxide (TCO) layer as the front conductive layer and P3 scribing of the solar cell in the deposition processing system in one arrangement. In another arrangement, light is applied after deposition of the front contact layer layer, P3 scribing of the solar cell, application of ethylene vinyl acetate (EVA), and lamination. In yet another arrangement, light is applied after the steps of deposition of the front contact layer, P3 scribing of the solar cell, application of ethylene vinyl acetate (EVA), a lamination process, and solar cell module completion. Note, light can be applied after any one or more of the steps of P3 scribing of the solar cell, a lamination process, and solar cell module completion. For example, in one embodiment, the light can be applied after each of the steps of P3 scribing of the solar cell, a lamination process, and solar cell module completion.

According to another aspect of the disclosure, a method for forming a solar cell is provided. The method includes forming a back contact layer on a glass substrate, forming an absorber layer on the back contact layer, forming a buffer layer on the absorber layer, and forming a front contact layer above the buffer layer, the glass substrate, the back contact layer, the absorber layer, the buffer layer, and the front contact layer which all form a first module. The method further includes applying a light source to the first module after forming the front contact layer above the buffer layer separate from other processing done in a deposition processing system. The method can further include P1 scribing after forming the back contact layer on the glass substrate, P2 scribing after forming the buffer layer on the absorber layer, and P3 scribing after forming the front contact layer above the buffer layer. In another aspect, the method includes applying an ethylene vinyl acetate (EVA) encapsulation layer after P3 scribing, and laminating the solar cell where applying the light source to the first module after forming the front contact layer above the buffer layer comprises applying ultraviolet (UV) light after P3 scribing and laminating the solar cell.

In another embodiment, the method includes applying an ethylene vinyl acetate (EVA) encapsulation layer after P3 scribing, laminating the solar cell, applying a backend process to the solar cell, and forming a solar cell module from the solar cell where applying the light source to the first module after forming the front contact layer above the buffer layer includes applying the light after forming the solar cell module.

In one arrangement, forming the back contact layer includes forming molybdenum on the glass substrate, forming the absorber layer on the back contact layer includes forming a layer of chalcopyrite or cadmium telluride, forming the buffer layer includes forming a cadmium sulfide layer or a zinc sulfide layer, and forming the front contact layer includes forming a transparent conductive oxide layer above the buffer layer. Alternatively, forming the front contact layer includes forming one of a oxynitride layer or a nitride layer with a selected extrinsic IIIA dopant of boron, aluminum, gallium, or indium.

According to yet another aspect of the disclosure, a method of making a solar cell, includes forming a back contact layer on a glass substrate by sputtering molybdenum on the glass substrate, forming an absorber layer on the back contact layer by sputtering or co-evaporating combinations of copper, indium, gallium, and selenium on the back contact layer or by sputtering cadmium telluride on the back contact layer, forming a buffer layer on the absorber layer by chemical bath deposition of cadmium sulfide or zinc sulfide on the absorber layer, forming a front contact layer above the buffer layer by atomic layer deposition (ALD), chemical vapor deposition (CVD), and evaporation or sputtering (PVD) and applying an ultra-violet (UV) light source to the front contact layer after forming the front contact layer above the buffer layer and separate from other processing in a deposition processing system.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of embodiments, it is not limited thereto. Rather, the appended claims should be construed broadly, to include other variants and embodiments of the disclosure, which may be made by those of ordinary skill in the art without departing from the scope and range of equivalents of the disclosure.

Furthermore, the above examples are illustrative only and are not intended to limit the scope of the disclosure as defined by the appended claims. Various modifications and variations can be made in the methods of the present subject matter without departing from the spirit and scope of the disclosure. Thus, it is intended that the claims cover the variations and modifications that can be made by those of ordinary skill in the art.

What we claim is:

1. A method of making a solar cell, comprising
forming a back contact layer on a glass substrate;
forming an absorber layer on the back contact layer;
forming a buffer layer on the absorber layer;
forming a front contact layer above the buffer layer, the glass substrate, the back contact layer, the absorber layer, the buffer layer, and the front contact layer forming a first module;
applying a light consisting essentially of ultraviolet (UV) light to the first module after forming the front contact layer above the buffer layer separate from other processing done in a deposition processing system.

2. The method of claim 1, further comprising P1 scribing after forming the back contact layer on the glass substrate, P2 scribing after forming the buffer layer on the absorber layer, and P3 scribing after forming the front contact layer above the buffer layer.

3. The method of claim 2, further comprising
applying an ethylene vinyl acetate (EVA) encapsulation layer after P3 scribing, and
laminating the solar cell.

4. The method of claim 3, wherein applying the light from a light source to the first module after forming the front contact layer above the buffer layer comprises applying ultraviolet (UV) light after P3 scribing and laminating the solar cell.

5. The method of claim 2, further comprising applying an ethylene vinyl acetate (EVA) encapsulation layer after P3 scribing, laminating the solar cell, applying a backend process to the solar cell, and forming a solar cell module from the solar cell.

6. The method of claim 5, wherein applying the light from a light source to the first module after forming the front contact layer above the buffer layer comprises applying the light after forming the solar cell module.

7. The method of claim 1, wherein forming the back contact layer comprises forming molybdenum on the glass substrate, forming the absorber layer on the back contact layer comprises forming a layer of chalcopyrite or cadmium telluride, forming the buffer layer comprises forming a cadmium sulfide layer or a zinc sulfide layer, and forming the front contact layer comprises forming a transparent conductive oxide layer above the buffer layer.

8. The method of claim 1, wherein forming the front contact layer comprises forming one of a oxynitride layer or a nitride layer with a selected extrinsic IIIA dopant of boron, aluminum, gallium, or indium.

9. A method of making a solar cell, comprising
forming a back contact layer on a glass substrate by sputtering molybdenum on the glass substrate;

forming an absorber layer on the back contact layer by sputtering or co-evaporating combinations of copper, indium, gallium, and selenium on the back contact layer or by sputtering cadmium telluride on the back contact layer;

forming a buffer layer on the absorber layer by chemical bath deposition of cadmium sulfide or zinc sulfide on the absorber layer;

forming a front contact layer above the buffer layer by atomic layer deposition (ALD), chemical vapor deposition (CVD), and evaporation or sputtering (PVD); and applying a light consisting essentially of ultra-violet (UV) light to the front contact layer after forming the front contact layer above the buffer layer and separate from other processing in a deposition processing system.

10. The method of claim 1, wherein the light is emitted by a light source comprising:
   a housing separate from other processing in the deposition processing system;
   a transport mechanism for carrying 1141 the solar cell on the substrate into the housing after deposition of the front contact layer in the deposition processing system; and
   one or more light source elements within the housing arranged to apply light on the solar cell after deposition of the front contact layer.

11. The method of claim 10, wherein the one or more light source elements are one or more ultraviolet (UV) light source elements and wherein the housing forms a UV light treatment chamber with the one or more UV source elements having tunable light intensity.

12. The method of claim 10, comprising an environmental temperature control system within the housing.

13. The method of claim 10, wherein the one or more light source elements produce light at a plurality of wavelength ranges in the range below about 400 nm.

14. The method of claim 10, wherein the transport mechanism is a carrier and roller that transports the solar cell in and out of the housing.

15. The method of claim 10, further comprising:
   P3 scribing of the solar cell,
   laminating the solar cell, and
   forming a solar cell module from the solar cell;
   wherein the step of applying the light source is performed after any one or more of the steps of P3 scribing, lamination, and solar cell module formation.

16. The method of claim 10, further comprising:
   P3 scribing of the solar cell,
   laminating the solar cell, and
   forming a solar cell module from the solar cell;
   wherein the step of applying the light is performed after each of the steps of P3 scribing, lamination, and solar cell module formation.

17. The method of claim 10, wherein the solar cell is one of a chalcopyrite-based device, a chalcopyrite-based tandem structure device, or a cadmium telluride based device.

18. A method of making a solar cell, comprising:
   forming a back contact layer on a glass substrate;
   forming an absorber layer on the back contact layer;
   forming a buffer layer on the absorber layer;
   forming a front contact layer above the buffer layer, the glass substrate, the back contact layer, the absorber layer, the buffer layer, and the front contact layer forming a first module;
   applying a light consisting essentially of ultraviolet (UV) light from a light source contained in a housing, separate from other processing done in a deposition processing system to the first module after forming the front contact layer above the buffer layer.

19. The method of claim 18, further comprising P3 scribing after forming the front contact layer and wherein the step of applying the light is performed after P3 scribing.

* * * * *